United States Patent
Aguiar et al.

(10) Patent No.: US 12,254,395 B2
(45) Date of Patent: Mar. 18, 2025

(54) SYSTEM AND METHOD FOR PROCESSING CONVOLUTIONS ON CROSSBAR-BASED NEURAL NETWORK ACCELERATORS FOR INCREASED INFERENCE THROUGHPUT

(71) Applicant: HEWLETT PACKARD ENTERPRISE DEVELOPMENT LP, Houston, TX (US)

(72) Inventors: Glaucimar Da Silva Aguiar, São Paulo (BR); Francisco Plínio Oliveira Silveira, Porto Alegre (BR); Eun Sub Lee, Plano, TX (US); Rodrigo Jose Da Rosa Antunes, Porto Alegre (BR); Joaquim Gomes Da Costa Eulalio De Souza, Porto Alegre (BR); Martin Foltin, Ft. Collins, CO (US); Jefferson Rodrigo Alves Cavalcante, Houston, TX (US); Lucas Leite, Houston, TX (US); Arthur Carvalho Walraven Da Cunha, Houston, TX (US); Monycky Vasconcelos Frazao, Houston, TX (US); Alex Ferreira Ramires Trajano, Fortaleza de Minas (BR)

(73) Assignee: Hewlett Packard Enterprise Development LP, Spring, TX (US)

( * ) Notice: Subject to any disclaimer, the term of this patent is extended or adjusted under 35 U.S.C. 154(b) by 1090 days.

(21) Appl. No.: 17/027,628

(22) Filed: Sep. 21, 2020

(65) Prior Publication Data
US 2022/0092393 A1  Mar. 24, 2022

(51) Int. Cl.
G06F 15/78 (2006.01)
G06F 17/16 (2006.01)
G06N 3/063 (2023.01)

(52) U.S. Cl.
CPC ......... G06N 3/063 (2013.01); G06F 15/7825 (2013.01); G06F 17/16 (2013.01)

(58) Field of Classification Search
CPC ............................ G06F 15/7825; G06N 3/063
See application file for complete search history.

(56) References Cited

U.S. PATENT DOCUMENTS 9,697,463 B2   7/2017  Ross et al.
9,805,303 B2 * 10/2017  Ross ..................... G06N 3/08
(Continued)

OTHER PUBLICATIONS

Zhu, Z. et al., Mixed Size Crossbar Based RRAM CNN Accelerator with Overlapped Mapping Method, ICCAD '18: Proceedings of the International Conference on Computer-Aided Design, Nov. 5-8, 2018, 8 pgs., ACM, San Diego, CA, USA.
(Continued)

Primary Examiner — Jacob Petranek
(74) Attorney, Agent, or Firm — Sheppard Mullin Richter & Hampton LLP

(57) ABSTRACT

Systems and methods are provided to improve traditional chip processing. Using crossbar computations, the convolution layer can be flattened into vectors, and the vectors can be grouped into a matrix where each row or column is a flattened filter. Each submatrix of the input corresponding to a position of a convolution window is also flattened into a vector. The convolution is computed as the dot product of each input vector and the filter matrix. Using intra-crossbar computations, the unused space of the crossbars is used to store replicas of the filters matrices and the unused space in XIN is used to store more elements of the input. In inter-crossbar computations, the unused crossbars are used to store replicas of the filters matrices and the unused XINs are used to store more elements of the input. Then, the method performs multiple convolution iterations in a single step.

21 Claims, 6 Drawing Sheets

(56) References Cited

U.S. PATENT DOCUMENTS

| | | | | |
|---|---|---|---|---|
| 2005/0049983 | A1* | 3/2005 | Butler | G06N 3/086 706/14 |
| 2016/0342893 | A1* | 11/2016 | Ross | G06N 3/045 |
| 2019/0354847 | A1* | 11/2019 | Rasch | G06N 3/045 |

OTHER PUBLICATIONS

Wang, X. et al., Bit Prudent In-cache Acceleration of Deep Convolutional Neural Networks, (Research Paper), 2019 IEEE International Symposium on High Performance Computer Architecture (HPCA), Feb. 2019, pp. 81-93.

Anderson et al., "Low-memory gemm-based convolution algorithms for deep neural networks", CVPR, Sep. 8, 2017, 13 pages.

Fan et al., "CSCC: Convolution Split Compression Calculation Algorithm for Deep Neural Network", IEEE Access, vol. 7, May 28, 2019, pp. 71607-71615.

Shafiee et al., "ISAAC: A convolutional neural network accelerator with in-situ analog arithmetic in crossbars", Oct. 5, 2016, 13 pages.

\* cited by examiner

Kernel 210A

Kernel 210B

Crossbar Weights Matrix 220

200

SYSTEM AND METHOD FOR PROCESSING CONVOLUTIONS ON CROSSBAR-BASED NEURAL NETWORK ACCELERATORS FOR INCREASED INFERENCE THROUGHPUT

DESCRIPTION OF RELATED ART

Computational load and computing needs have increased and become more complex in recent years to keep up with computational innovations. Heterogeneous computing devices such as GPU (Graphics Processing Unit), FPGA (Field Programmable Gate Array), and ASIC (Application Specific Integrated Circuit) are often required to accelerate these computations. However, despite the improved processor technology, more innovation is needed to improve processing efficiency and power overall to keep up with the computational requirements.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
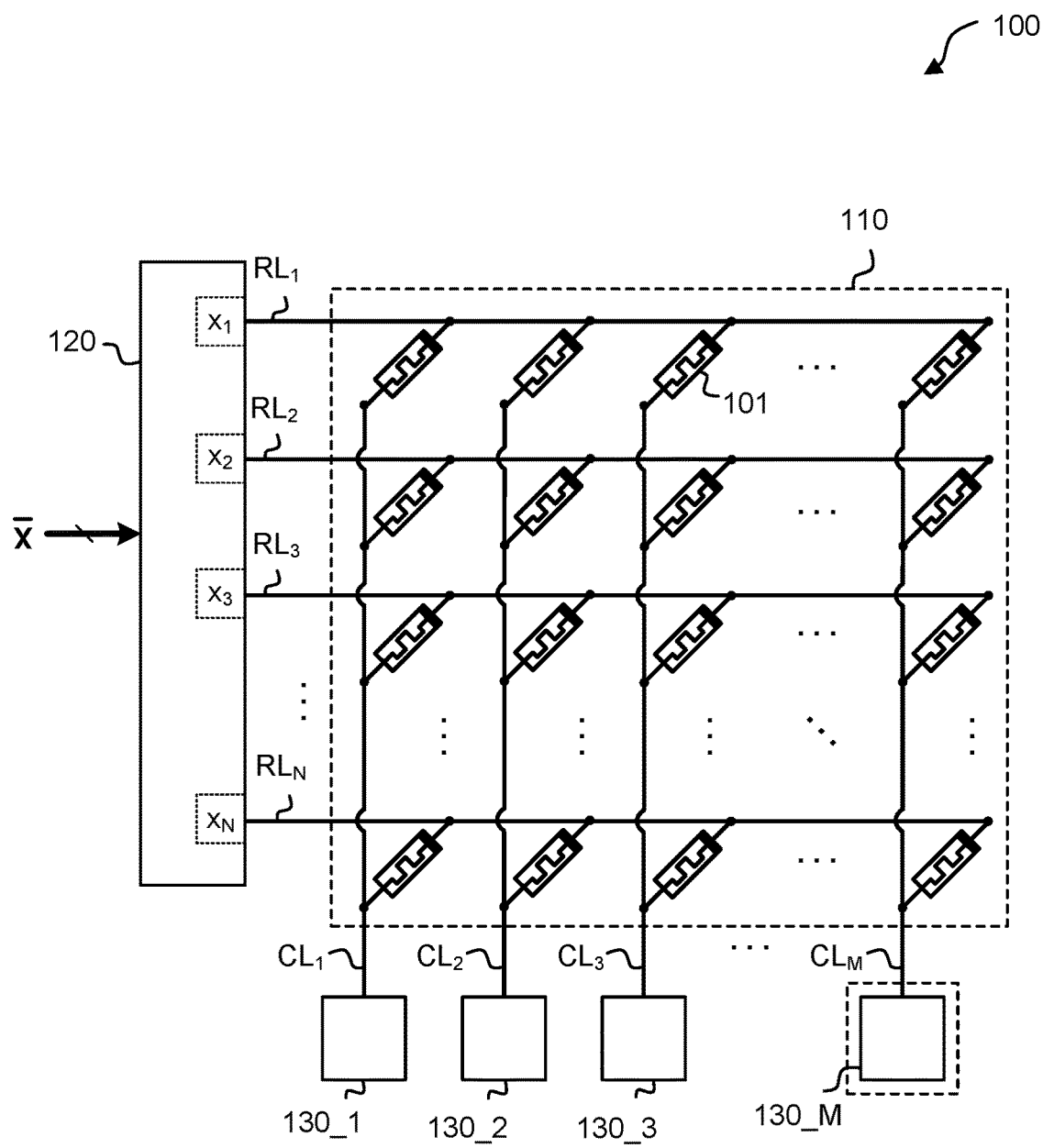
FIG. 1 provides an example electronic device, in accordance with embodiments of the application.

The figures are not exhaustive and do not limit the present disclosure to the precise form disclosed.

DETAILED DESCRIPTION

In traditional chip processing, accelerators are used to perform several complex computations. For example, in a convolution neural network (CNN) and other types of artificial neural networks, the network is made up of neurons that have learnable weights and biases. The weights of these networks are initialized with zeros to allow the neurons to learn features during training. Each neuron receives some inputs, performs a dot product, and potentially adjusts the weights for that layer as the training progresses. As such, the weights can be adjusted for each specific training task.

However, with traditional chip processing, these training computations are performed serially and can waste processing power that would otherwise be available on the chip. This is especially wasteful in deep learning processes. For example, in a convolution neural networks (CNN) and some other classes of deep neural networks, the processing is performed at each layer. The layer's parameters consist of a set of learnable filters or kernels, which have a small receptive field, but extend through the full depth of the input. During the forward pass, each filter is convolved across the width and height of the input volume, computing the dot product between the entries of the filter and the input, and producing a 2-dimensional activation map of that filter. As a result, the network learns filters that activate when it detects some specific type of feature at a spatial position in the input.

At the small layers of the CNN, the determined number of weights are low and the size of the input is high. By setting the weights to zero initially, the computations associated with these initial layers is inefficient compared to the later, convolved layers because the weights are eventually learned by the CNN through making iterative adjustments to these weights.

One possible solution to this inefficiency would be to initialize the weights with random values. This too might waste computational power, since the iterative adjustments to the weights may set the value of the weight at a greater distance to the final weight value, potentially causing more iterative adjustments to be performed. However, these random values would be inappropriate values that would lead to divergence of the CNN or a slow-down in the training of the CNN.

Embodiments described herein improve the computation of convolutions on crossbar-based accelerators like Dot Product Engine (DPE) that are inefficiently used in traditional chip processing by incorporating intra-crossbar computations and inter-crossbar computations. In crossbar computations, the convolution layer can be flattened into vectors, and the vectors can be grouped into a matrix where each row or column is a flattened filter. Each submatrix of the input corresponding to a position of a convolution window is also flattened into a vector. The convolution is computed as the dot product of each input vector and the filter matrix. In intra-crossbar computations, the unused space of the crossbars is used to store replicas of the filters matrices and the unused space in XIN is used to store more elements of the input. In inter-crossbar computations, the unused crossbars are used to store replicas of the filters matrices and the unused XINs are used to store more elements of the input. Then, the method performs multiple convolution iterations in a single step.

Embodiments of the application also reduce the number of computations needed to convolve large inputs. For example, during each convolution, the system may extract useful features from the input using different types of filters whose weights are automatically learned during the training. In some embodiments of the application, the filters may be replicated and the convolutions may be performed on unused crossbars in the chip. By extrapolating the inter-crossbar filters replication technique, the system can apply the improved convolution process even when the crossbar is already fully utilized but there are unused crossbars in the chip.

The intra-crossbar computations can reduce the waste of resources of large crossbars when computing convolutions with small kernels (e.g., the kernels fill a small percentage of the crossbar space). The size of the filters or kernels may not be changed, but the system may implement inter-crossbar computations and intra-crossbar computations to perform multiple convolution iterations in a single step. Additionally, when combining the intra-crossbar computations with inter-crossbar computations, the system is enabled the use of larger crossbars while ensuring efficiency regardless of the size of convolution kernels. This may be helpful to improve at least the beginning of processing a CNN, where traditional systems utilize a low number of weights and a high size of input.

FIG. 1 provides an example electronic device, in accordance with embodiments of the application. In some examples, the electronic device (e.g., an accelerator, etc.) is organized in a hierarchy of crossbars as well as a local processor that orchestrates computation and performs the operations not handled by the crossbars. The crossbars may perform MVM on a fixed-size matrix block. The example electronic device illustrated in FIG. 1 includes memristor crossbar array 100, row driver circuitry 120, and a number of column output circuits 130 that each correspond to one of the column lines CL of the memristor crossbar array 100.

The memristor crossbar array 100 may include N row lines RL (where N≥1), M column lines CL (where M≥1), and a number of memristors 101 that each are connected between one of the row lines RL and one of the column lines CL. In certain examples, each intersection of a row line RL with a column line CL may have a corresponding memristor 101. Each of the row lines $RL_n$ may correspond to a digital input value $x_n$ of a digital input vector $\overline{X}=(x_1, x_2, \ldots, x_N)$. Specifically, row line $RL_1$ corresponds to digital input value $x_1$, row line $RL_2$ corresponds to digital input value $x_2$, and so on.

Row driver circuitry 120 serves as an input stage of crossbar array 100, and may apply analog voltages to the row lines RL across a plurality of time periods based on the digital input vector $\overline{X}$ according to a distributed digital-to-analog conversion architecture. Specifically, in certain examples the row driver circuitry 120 may apply a plurality of analog voltages $V_1, V_2, \ldots V_P$ to a node during a plurality of time periods $t_1, t_2, \ldots, t_P$, respectively, and, for each of the row lines RL, selectively connect the row line $RL_n$ to the node during one of the plurality of time periods $t_1, t_2, \ldots, t_P$ based on the corresponding digital input value $x_n$ of the digital input vector $\overline{X}$. For example, any row lines $RL_n$ whose digital input value $x_n$ is equal to "1" may be connected to the node during the first time period $t_1$, any row lines $RL_n$ whose digital input value $x_n$ is equal to "2" may be connected to the node during the first time period $t_2$, and so on.

Column output circuits 130 may each include an integration capacitor $C_{int}$ and a switch $S_1$ that is controlled by an integration control signal Ctr_Int. Details of one of the column output circuits 130 (namely, the column output circuit 130_M). In certain examples, each of the column output circuits 130 may include similar features in similar configurations (except for being connected to different column lines CL).

The electronic device illustrated in FIG. 1 may be configured to process the digital input vector $\overline{X}$ during a processing period that comprises at least the time periods $t_1$, $t_2, \ldots, t_P$. As noted above, the row driver circuitry 120 may apply a voltage to the node during each of the time periods $t_1, t_2, \ldots, t_P$. In addition, during each of the time periods $t_1, t_2, \ldots, t_P$, the integration control signal Crt_Int is to close the switch $S_1$ for a specified amount of time $t_{int}$. For example, if the switch $S_1$ is configured to be closed when Crt_Int is at a high logical value, then Crt_Int may be pulsed high during each of the time periods $t_1, t_2, \ldots, t_P$ with a width of the pulse being $t_{int}$, where $t_{int}$ is smaller than the duration of any of the time periods $t_1, t_2, \ldots, t_P$. The timings at which Crt_Int is pulsed may be set such that transient effects resulting from the changing of voltages that are applied to the row lines RL may have subsided before Crt_Int is pulsed. For example, since the voltages applied to the row lines RL change at the start of each time of the time periods $t_1, t_2, t_P$, the integration control signal Crt_Int may be pulsed a period of time Δt after the start of each of the time periods $t_1, t_2, \ldots, t_P$, where Δt is set so as to avoid any transient effects. For example, if to is the duration of each of the time periods $t_1, t_2, \ldots, t_P$, then the integration control signal Crt_Int may be pulsed at timings that are $\Delta t \geq \frac{1}{2} t_A$ after the start of each of the time periods $t_1, t_2, \ldots, t_P$. In certain examples, $t_{int}$ may be less than $\frac{1}{2} \cdot t_A$.

Thus, at each time period $t_p$, a charge packet $Q_p$ is subtracted from (or, in some examples, added to) the first electrode of the capacitor $C_{int}$, where the magnitude of $Q_p$ depends on the current $I_p$ that is flowing on the corresponding column CL during $t_p$.

For each column output circuit 130, the voltage difference $\Delta V_C$ may be determined from the voltage $V_C$ output via the output node $N_{out}$, and an output value $y_m$ for the corresponding column line CL may be generated based on $\Delta V_C$. The outputting of the voltage $V_C$ may include, for example, selectively connecting the node $N_{out}$ to a subsequent processing stage (e.g., via a switch (not illustrated)) and/or sampling the voltage $V_C$ of the node $N_{out}$. For example, the voltage $V_C$ of the output node $N_{out}$ may be output to an analog buffer or an ADC from which the output value $y_m$ may be generated. As another example, the voltage $V_C$ of the output node $N_{out}$ may be sampled and the output value $y_m$ may be generated based on the sampled voltage ($V_{samp}$).

In the electronic device illustrated in FIG. 1, the timings at which voltages are applied to row lines RL may vary according to the digital input vector $\overline{X}$. For example, for a given input phase, during some of the time periods $t_1$, $t_2, \ldots, t_P$ none of the row lines RL may have a voltage applied thereto, during others of the time periods $t_1$, $t_2, \ldots, t_P$, a single row line RL may have a voltage applied thereto, and during others of the time periods $t_1, t_2, \ldots, t_P$, multiple row lines RL may have a voltage applied thereto simultaneously.

Crossbar array 100, as illustrated, has four or more row lines RL and four or more column lines CL, but this is merely one example used for convenience of description and any numbers of row lines RL and column lines CL greater than or equal to one may be included. Moreover, in certain examples, in addition to the row lines RL described above, additional row lines (not illustrated) may be provided in the crossbar array 100 that do not correspond to a digital input value $x_n$ of the digital input vector $\overline{X}$. Examples of possible row lines that do not have a corresponding digital input value $x_n$ may include dummy lines, calibration lines, error correction lines, and the like. Herein and in the appended claims, any references to "row lines" mean those row lines that correspond to a digital input value $x_n$ of the digital input vector $\overline{X}$ and not any other row lines that might be included in the crossbar array 100, unless specifically indicated otherwise. Thus, for example, a phrase such as "each of the row lines" should be understood to refer to each row line that corresponds to a digital input value $x_n$ of the digital input vector $\overline{X}$ and not to other possible row lines (such as an offset line), unless specifically indicated otherwise.

In certain examples, the electronic device illustrated in FIG. 1 may include an artificial neural network ("ANN"). For example, crossbar array 100, row driver circuitry 120, and column output circuits 130, may correspond to a first layer of the ANN. In such an example, each MAC of the crossbar array 100 may correspond to an individual neuron. Specifically, each column may correspond to an individual neuron, and the neuron may include each of the memristors 101 in the corresponding column together with the column output circuit 130 of the corresponding column. In certain examples, each column of the crossbar array 100 corresponds to exactly one neuron (e.g., there is a one-to-one correspondence between columns and neurons), while in other examples more than one column may correspond to multiple neurons (e.g., there is a many-to-one correspondence between columns and neurons). There may be additional layers of the ANN subsequent to the first layer, in which case the output $\overline{Y}=(y_1, y_2, \ldots, y_M)$ of the first layer may be fed to the second layer as an input thereof.

Figure 2:
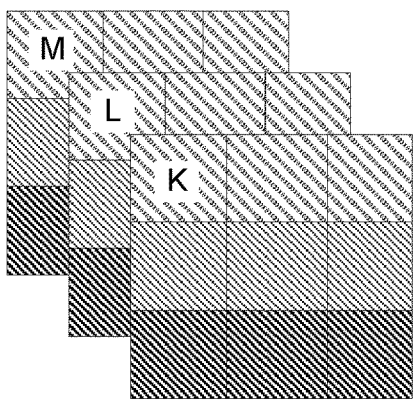
FIG. 2 illustrates kernels with a crossbar weights matrix, in accordance with embodiments of the application.
Figure 2:
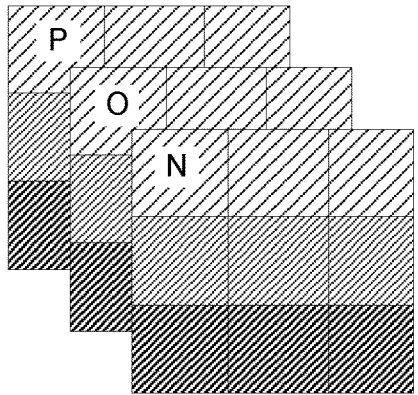
Figure 2:
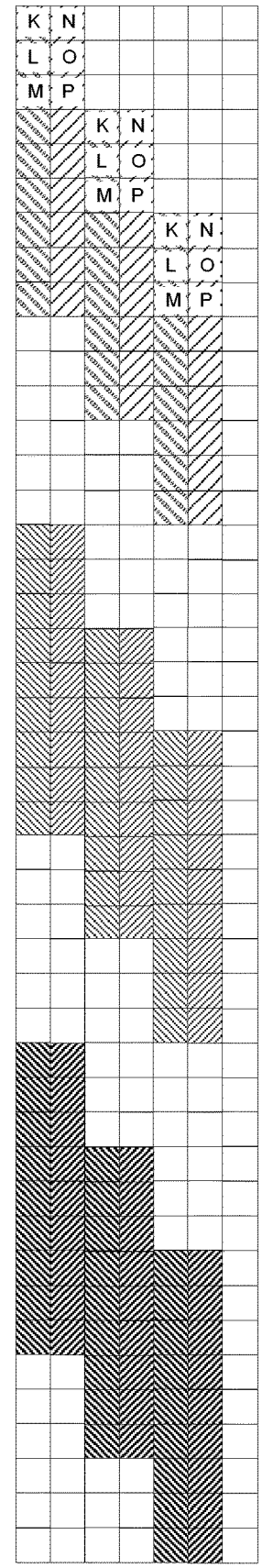

FIG. 2 illustrates kernels with a crossbar weights matrix, in accordance with embodiments of the application. Kernels 210 (illustrated as kernel 210A and kernel 210B) may implement intra-crossbar parallelization and inter-crossbar parallelization, as illustrated in crossbar weights matrix 220.

Kernels 210 may comprise weights that are converted in crossbar weights matrix 220. Each kernel 210A and 210B may comprise three different sets of input data points in a three-by-three kernel, however any size of kernel is available without diverting from the essence of the disclosure. In the sample illustration, when the input data enters the crossbar, concurrently the same input vector can operate on the three different sets of input data points. Each three by three kernel may correspond with nine multiplication operations in each of these kernels. The calculations may be performed across three input feature maps, which correspond with nine times three, or twenty-seven operations at a particular time for each of the three kernels. Kernel 210A may produce output element Y0 and kernel 210B may produce output element Y1, where each of these outputs correspond with twenty-seven computations.

Each kernel 210A and 210B may be replicated. On crossbar weights matrix 220, columns 3 and 4 may use replicas of the same initial kernel, operating on successive inputs to produce successive outputs. Similarly, columns 5 and 6 may use replicas of the same initial kernel, which again are operating on successive inputs to produce successive outputs. In other words, kernel 210A is copied three times and kernel 210B is copied three times to compute simultaneously to operate on three different sets of input data points. The overlap of the three-by-three input regions may increase computational efficiency since the system is not using three times more resources, but rather a duplication of existing resources (e.g., approximately one-third of the resources required in traditional systems).

In some examples, kernels 210 may correspond with a small size in relation to a threshold size of crossbar weights matrix 220. The size may correspond with the existing fixed size crossbar. When kernels 210 are larger than the threshold size, the corresponding size in the crossbar may be wasted in early convolution stages, creating a computing inefficiency.

In intra-crossbar parallelization, the weights may be packed in the small sizes of kernels 210 and multiple kernels may be implemented in one crossbar. The input data corresponding with each kernel may pack the data with kernels 210 to get the correct matrix multiplication result.

In intra-crossbar parallelization, the first layers (e.g., upstream layers, layers close to the beginning of the CNN, etc.) have a relatively small weights matrix and crossbar weights matrix 220 is a fixed size. In the initial convolution steps, the unused space in the crossbar can be used more efficiently by parallelizing the iterations in the first layers. This may use fewer resources in the initial convolution steps, so fewer resources are needed in the later convolution steps in the fixed size system. Additionally, the computations may be accelerated by parallelizing the separate iterations that the system computes.

Various processes may be considered to incorporate weights with each crossbar ("mvmu"). For example, an illustrative input feature may correspond with two convolutions ("convs") in one crossbar for two convolution per crossbar ("conv/mvmu"). This may correspond with eight weights per mvmu and the process may correspond with four loads of two elements. In another example, an illustrative input feature may correspond with three convs in one crossbar for three conv/mvmu. This may correspond with twelve weights per mvmu and the process may correspond with four loads of two elements with a transposed output. In another example, an illustrative input feature may correspond with three convs with one crossbar for three conv/mvmu. This may correspond with twelve weights per mvmu and the process may correspond with two loads of four elements with an aligned output.

In some examples, the weights in the matrix structure of weights may be replicated in the intra-crossbar parallelization. When the weights are replicated, a different example may be provided. For example, an illustrative input feature may correspond with seven convs with two crossbars for 3.5 conv/mvmu. This may correspond with fourteen weights per mvmu and the process may correspond with one load of eight elements with an aligned output. These replicated weights may help maximize the number of convolutions per crossbar ("mvmu").

The size of crossbar weights matrix 220 may be determined. A smaller size crossbar may require additional circuits in the overall system, including additional inputs, more output buffers, and additional circuits that perform operations in the other parts of the computation other than the matrix multiplication. A larger size crossbar may allow greater parallelization of crossbar weights matrix 220 as well as parallelizing more elements of the matrix multiplication, but the system may generate more unused space in the initial convolution steps.

In some examples, the tradeoff of smaller crossbars or larger crossbars may be considered during the design of the accelerator. For example, sizes of popular CNNs may be used as reference for the sizes of the weights matrices. Graphs illustrated in FIG. 4 may correspond with examples of two CNNs that are targeted to design a prototype, along with consideration of the weights of these neural networks.

An illustrative example is provided herein. Layer: conv5.2 (e.g., downstream layer, or a layer closer to the end of the neural network model). Number of weights: 512 kernels of 3×3×512=2359296. Using crossbars of 256× 256=65536 elements (e.g., memristor 101 in FIG. 1). Calculation: 2359296/65536=36 crossbars required to store the weights (without replication). While Layer: conv2.1.1 (e.g., upstream layer, or a layer closer to the beginning of the neural network model). Number of weights: 64 kernels of 1×1×64=4096. Using crossbars of 256×256=65536 elements (e.g., memristor 101 in FIG. 1). Calculation: 4096/65536=1/16 of one crossbar required, or 15/16 of the crossbar could be wasted if no intra-crossbar replication was applied.

In another illustrative example of 128×128 crossbars, more crossbars may be needed to fit large layers (e.g., like layer conv5.2) and less space may be wasted in small layers (e.g., like layer conv2.1.1). With using intra-crossbar replication, the wasted space may be avoided and larger crossbars can be used to avoid the first problem (e.g., need more crossbars to large layers). In another example, 512×512 crossbars may be added using the processes described herein and including additional circuits or memory.

Inter-crossbar parallelization may also be implemented. For example, kernels 210 may be duplicated according to multiple crossbars, so that the system implements a balanced execution. The computations performed in downstream layers of the neural network do not sit idle waiting for available data to compute. Instead, the upstream layers are duplicated and parallelized more than the downstream layers, because those upstream layers are more computationally intensive.

The optimal number of replications may be achieved when all the layers require the same number of iterations of the layer with the smallest number of convolutions. The filters of the first layer may be replicated multiple times, and the replication of the entire crossbar may be replicated proportionally fewer times.

Intra-crossbar parallelization and inter-crossbar parallelization together may increase computing performance without the need to excessively duplicate resources. This may be realized by packing the weights in the crossbar in the input vectors to enable sharing those kernels within the crossbar utilization. The inter-crossbar parallelization by itself may increase performance, but may require a somewhat excessive duplication of resources in comparison to the implementation with intra-crossbar parallelization. A combination with inter-crossbar parallelization and intra-crossbar parallelization may reduce the amount of resources needed for the same performance.

Both intra and inter filters replication may be applied together. By combining both techniques, an optimal acceleration of the inter-crossbar replication may be achieved while reducing the number of extra resources required due to the intra-crossbar replication.

Figure 3:
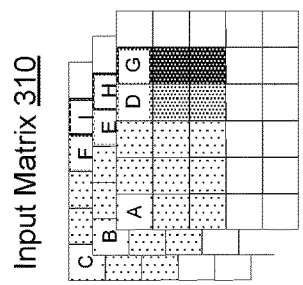
FIG. 3 illustrates an input matrix with a crossbar input vector during a plurality of convolution steps, in accordance with embodiments of the application.
Figure 3:
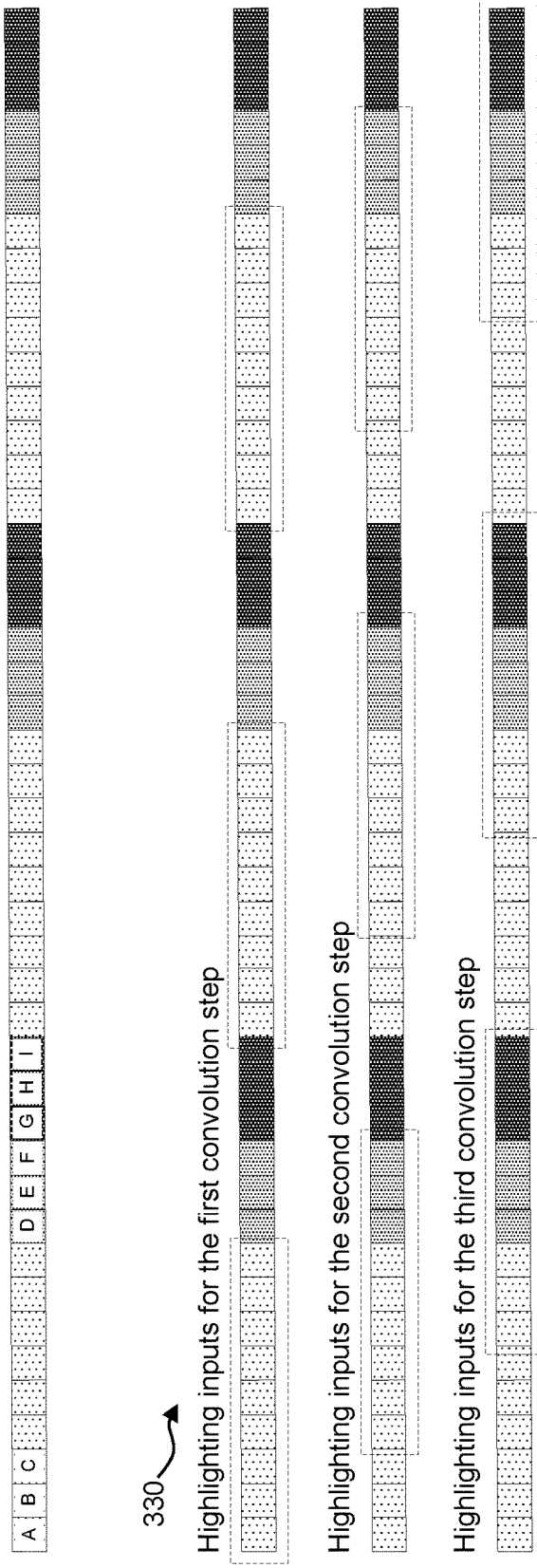

FIG. 3 illustrates an input matrix with a crossbar input vector during a plurality of convolution steps, in accordance with embodiments of the application. In illustrative convolution process 300, three different filters or kernels are operating on input data 310. In some examples, the first kernel produces the output vector element Y1, and the second kernel produces the output vector element Y2 and the third kernel produces the output vector element Y3. In the nature of parallel matrix vector multiplication, output vector elements Y1, Y2, and Y3 may be produced concurrently and, by implementing intra-crossbar parallelization and inter-crossbar parallelization, may comprise different data points.

Figure 4:
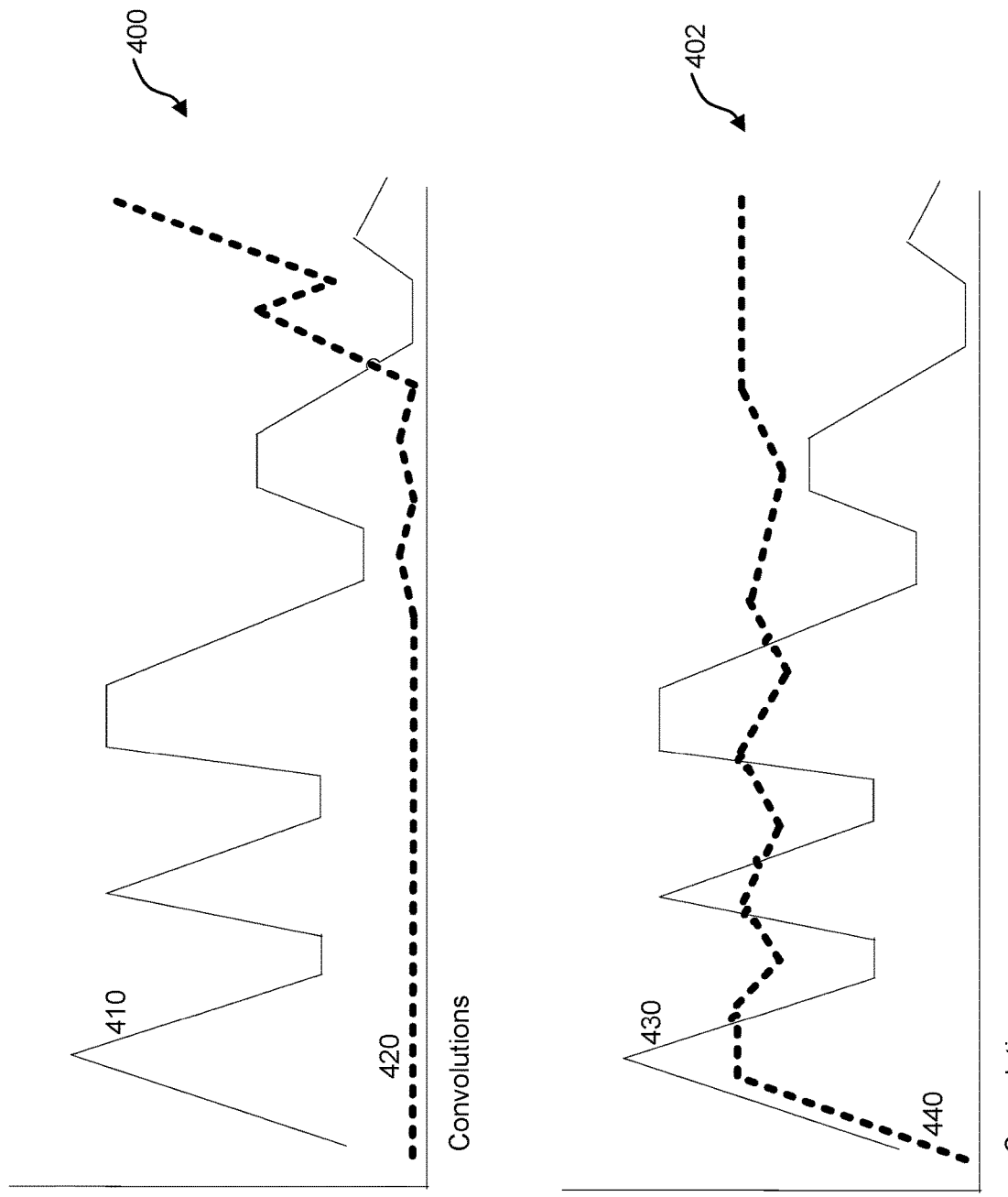
FIG. 4 illustrates a comparison of weights and inputs in two systems, in accordance with embodiments of the application.

FIG. 4 illustrates a comparison of weights and inputs in two systems, in accordance with embodiments of the application. Systems 400, 402 illustrate input data 410, 430 received by the convolution neural network layers corresponding with a number of convolution steps and corresponding weights 420, 440 for each system, respectively.

In traditional system 400, input data 410 may vary over the number of convolution steps and the size of the weights 420 for computing the input data may initially be low and gradually increase according to the layer. Since size of the weights 420 are small initially, traditional system 400 may not reach full optimization of the crossbars.

In system 402, input data 430 may similarly vary over the layers as shown with the traditional system 400. However, size of the weights 440 corresponding with system 402 may be increased initially to correspond with input data 430 using inter-crossbar parallelization and intra-crossbar parallelization, as described herein.

Figure 5:
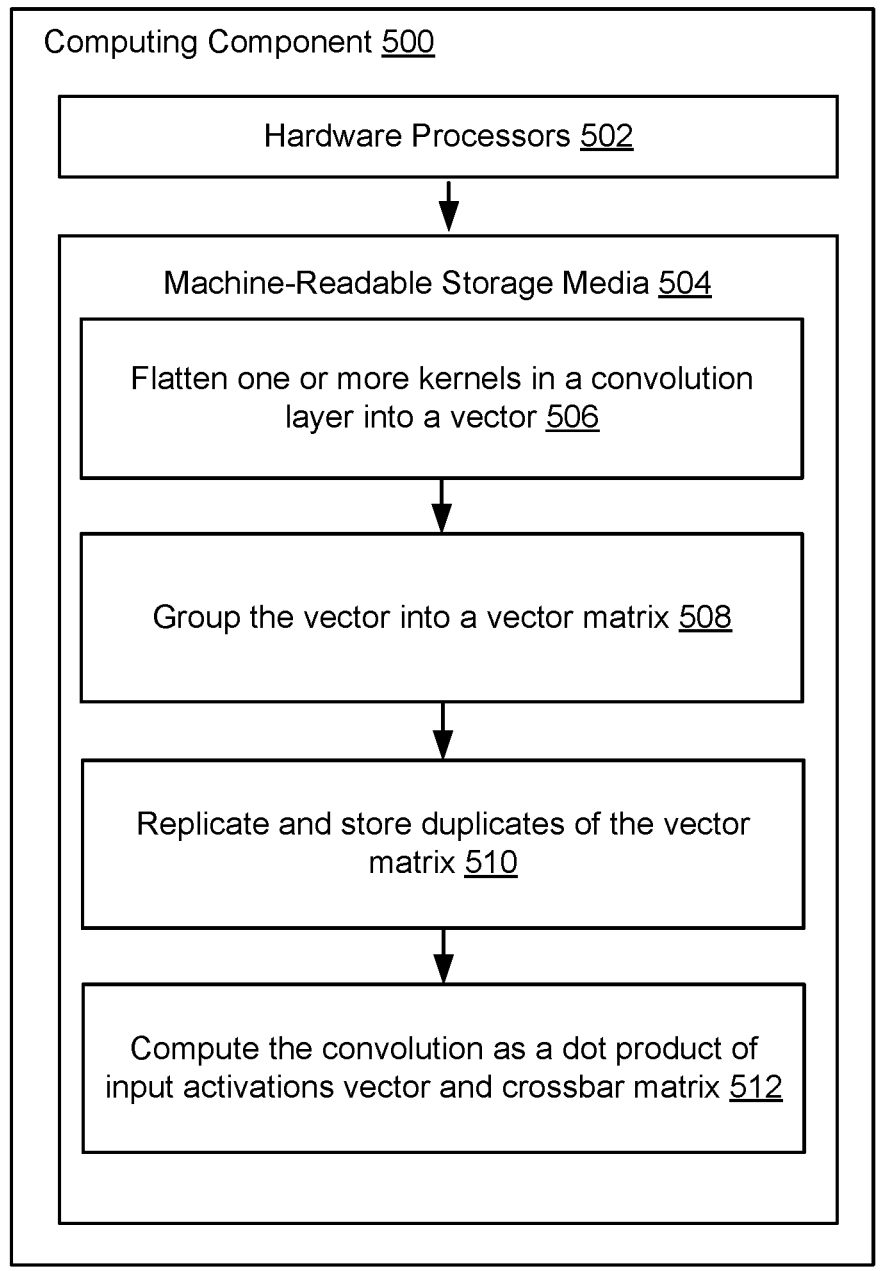
FIG. 5 is an example computing component that may be used to implement various features of embodiments described in the present disclosure.

FIG. 5 illustrates an example iterative process performed by a computing component 500 for processing convolutions on crossbar-based neural network accelerators for increased inference throughput. Computing component 500 may be, for example, a server computer, a controller, or any other similar computing component capable of processing data. In the example implementation of FIG. 5, the computing component 500 includes a hardware processor 502, and machine-readable storage medium 504. In some embodiments, computing component 500 may be an embodiment of a system corresponding with memristor crossbar array 100 of FIG. 1.

Hardware processor 502 may be one or more central processing units (CPUs), semiconductor-based microprocessors, and/or other hardware devices suitable for retrieval and execution of instructions stored in machine-readable storage medium 504. Hardware processor 502 may fetch, decode, and execute instructions, such as instructions 506-512, to control processes or operations for optimizing the system during run-time. As an alternative or in addition to retrieving and executing instructions, hardware processor 502 may include one or more electronic circuits that include electronic components for performing the functionality of one or more instructions, such as a field programmable gate array (FPGA), application specific integrated circuit (ASIC), or other electronic circuits.

A machine-readable storage medium, such as machine-readable storage medium 504, may be any electronic, magnetic, optical, or other physical storage device that contains or stores executable instructions. Thus, machine-readable storage medium 504 may be, for example, Random Access Memory (RAM), non-volatile RAM (NVRAM), an Electrically Erasable Programmable Read-Only Memory (EEPROM), a storage device, an optical disc, and the like. In some embodiments, machine-readable storage medium 504 may be a non-transitory storage medium, where the term "non-transitory" does not encompass transitory propagating signals. As described in detail below, machine-readable storage medium 504 may be encoded with executable instructions, for example, instructions 506-512.

Hardware processor 502 may execute instruction 506 to flatten one or more kernels in a convolution layer into a vector. This instruction may be repeated for each convolution layer in a plurality of convolution layers. In some examples, each convolution layer in the plurality of convolution layers comprises a plurality of kernels and each kernel in the plurality of kernels comprises a respective matrix structure of weights.

Hardware processor 502 may execute instruction 508 to group the vector into a vector matrix.

Hardware processor 502 may execute instruction 510 to replicate and store duplicates of the vector matrix according to a number and size on the convolution layer of the convolutional neural network and a crossbar size. In some examples, the duplicates are stored in unused space of the crossbar of the integrated chip, comprising a crossbar matrix.

Hardware processor 502 may execute instruction 512 to compute the convolution as a dot product of input activations vector and the crossbar matrix.

It should be noted that the terms "optimize," "optimal" and the like as used herein can be used to mean making or achieving performance as effective or perfect as possible. However, as one of ordinary skill in the art reading this document will recognize, perfection cannot always be achieved. Accordingly, these terms can also encompass making or achieving performance as good or effective as possible or practical under the given circumstances, or making or achieving performance better than that which can be achieved with other settings or parameters.

Figure 6:
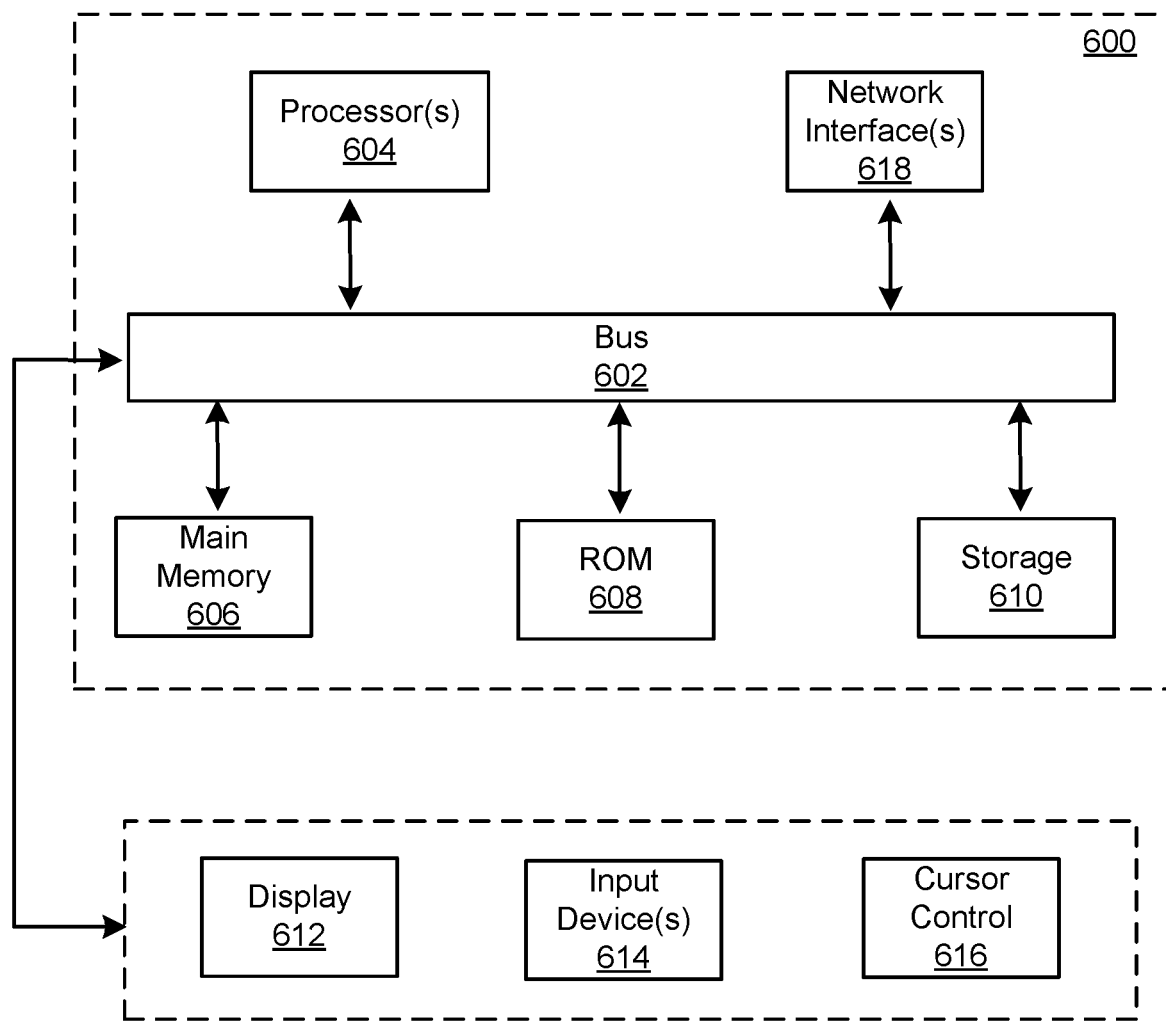
FIG. 6 is an example computer system that may be used to implement various features of embodiments described in the present disclosure.

The integrated chip may be implemented with a computer system, as illustrated in FIG. 6. FIG. 6 depicts a block diagram of an example computer system 600 in which various of the embodiments described herein may be implemented. The computer system 600 includes a bus 602 or other communication mechanism for communicating information, one or more hardware processors 604 coupled with bus 602 for processing information. Hardware processor(s) 604 may be, for example, one or more general purpose microprocessors.

The computer system 600 also includes a main memory 606, such as a random access memory (RAM), cache and/or other dynamic storage devices, coupled to bus 602 for storing information and instructions to be executed by processor 604. Main memory 606 also may be used for storing temporary variables or other intermediate information during execution of instructions to be executed by processor 604. Such instructions, when stored in storage media accessible to processor 604, render computer system 600 into a special-purpose machine that is customized to perform the operations specified in the instructions.

The computer system 600 further includes a read only memory (ROM) 608 or other static storage device coupled to bus 602 for storing static information and instructions for processor 604. A storage device 610, such as a magnetic disk, optical disk, or USB thumb drive (Flash drive), etc., is provided and coupled to bus 602 for storing information and instructions.

The computer system 600 may be coupled via bus 602 to a display 612, such as a liquid crystal display (LCD) (or touch screen), for displaying information to a computer user. An input device 614, including alphanumeric and other keys, is coupled to bus 602 for communicating information and command selections to processor 604. Another type of user input device is cursor control 616, such as a mouse, a trackball, or cursor direction keys for communicating direction information and command selections to processor 604 and for controlling cursor movement on display 612. In some embodiments, the same direction information and command selections as cursor control may be implemented via receiving touches on a touch screen without a cursor.

The computing system 600 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 600 may implement the techniques described herein using customized hard-wired logic, one or more ASICs or FPGAs, firmware and/or program logic which in combination with the computer system causes or programs computer system 600 to be a special-purpose machine. According to one embodiment, the techniques herein are performed by computer system 600 in response to processor(s) 604 executing one or more sequences of one or more instructions contained in main memory 606. Such instructions may be read into main memory 606 from another storage medium, such as storage device 610. Execution of the sequences of instructions contained in main memory 606 causes processor(s) 604 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 610. Volatile media includes dynamic memory, such as main memory 606. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 602. Transmission media can also take the form of acoustic or light waves, such as those generated during radio-wave and infra-red data communications.

The computer system 600 also includes a communication interface 618 coupled to bus 602. Communication interface 618 provides a two-way data communication coupling to one or more network links that are connected to one or more local networks. For example, communication interface 618 may be an integrated services digital network (ISDN) card, cable modem, satellite modem, or a modem to provide a data communication connection to a corresponding type of telephone line. As another example, communication interface 618 may be a local area network (LAN) card to provide a data communication connection to a compatible LAN (or WAN component to communicated with a WAN). Wireless links may also be implemented. In any such implementation, communication interface 618 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical signals that carry digital data streams. The signals through the various networks and the signals on network link and through communication interface 618, which carry the digital data to and from computer system 600, are example forms of transmission media.

The computer system 600 can send messages and receive data, including program code, through the network(s), network link and communication interface 618. In the Internet example, a server might transmit a requested code for an application program through the Internet, the ISP, the local network and the communication interface 618.

The received code may be executed by processor 604 as it is received, and/or stored in storage device 610, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 600.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. An integrated chip for computing an output for a convolutional neural network, the integrated chip comprising:
   a plurality of convolution layers, wherein a convolution layer in the plurality of convolution layers comprises a plurality of kernels and a kernel in the plurality of kernels comprises a respective matrix structure of weights;
   for the convolution layer in the plurality of convolution layers, the integrated chip is configured to execute instructions that cause the integrated chip to perform intra-crossbar parallelization and inter-crossbar parallelization that compute simultaneously on input data points via a method comprising:
   flattening the kernel in the plurality of kernels into vectors;
   grouping the vectors into a vector matrix, where the vector matrix comprises a plurality of lines;
   replicating and storing duplicates of the vector matrix according to a number and size on the convolution layer of the convolutional neural network and a crossbar size of a crossbar, wherein the duplicates are stored in unused space of the crossbar of the integrated chip, comprising a crossbar matrix; and
   computing a first convolution of the convolution layer as a dot product of input activations vector and the crossbar matrix, wherein the first convolution of the convolution layer corresponds with smaller weights than a second convolution of the convolution layer to parallelize separate iterations in the convolution layer in alignment with the intra-crossbar parallelization, and wherein the duplicates are computed simultaneously on the input data points to perform the intra-crossbar parallelization and the inter-crossbar parallelization.

2. The integrated chip of claim 1, wherein the plurality of kernels correspond with three-by-three kernels.

3. The integrated chip of claim 1, further comprising:
   a plurality of tiles connected with network on a chip, wherein each tile of the plurality of tiles is composed of SRAM or eDRAM memory buffers to store input values, a number of in-situ multiply-accumulate (IMA) units comprising a plurality of crossbars, and output registers to aggregate results, all connected with a shared bus.

4. The integrated chip of claim 1, wherein the weights in the respective matrix structure of weights are replicated in an intra-crossbar parallelization.

5. The integrated chip of claim 1, wherein the respective matrix structure of weights operates on successive inputs to produce successive outputs.

6. The integrated chip of claim 1, wherein a size of the respective matrix structure of weights is corresponds with a size of the crossbar of the integrated chip.

7. The integrated chip of claim 1, wherein a size of the kernels in the convolution layer in the plurality of convolution layers is smaller than a threshold size of a crossbar weights matrix.

8. The integrated chip of claim 1, wherein the integrated chip is further configured to execute instructions that cause the integrated chip to perform the intra-crossbar parallelization and the inter-crossbar parallelization via the method further comprising:
successively providing different portions of the input data points to the duplicates of the vector matrix that are configured to produce successive outputs corresponding with the different portions of the input data points.

9. A computer-implemented method for computing an output for a convolutional neural network, the method comprising:
for a convolution layer in a plurality of convolution layers configured to perform intra- crossbar parallelization and inter-crossbar parallelization that compute simultaneously on input data points by:
flattening kernels in the convolution layer into vectors;
grouping the vectors into a vector matrix, where the vector matrix comprises a plurality of lines;
replicating and storing duplicates of the vector matrix according to a number and size on the convolution layer of the convolutional neural network and a crossbar size of a crossbar, wherein the duplicates are stored in unused space of the crossbar of an integrated chip, comprising a crossbar matrix; and
computing a first convolution of the convolution layer as a dot product of input activations vector and the crossbar matrix, wherein the first convolution of the convolution layer corresponds with smaller weights than a second convolution of the convolution layer to parallelize separate iterations in the convolution layer in alignment with the intra-crossbar parallelization, and wherein the duplicates are computed simultaneously on the input data points to perform the intra-crossbar parallelization and the inter-crossbar parallelization.

10. The computer-implemented method of claim 9, wherein the kernels correspond with three-by-three kernels.

11. The computer-implemented method of claim 9, wherein the method is implemented with a plurality of tiles connected with network on a chip, wherein each tile of the plurality of tiles is composed of SRAM or eDRAM memory buffers to store input values, a number of in-situ multiply-accumulate (IMA) units comprising a plurality of crossbars, and output registers to aggregate results, all connected with a shared bus.

12. The computer-implemented method of claim 9, wherein weights in a matrix structure of weights are replicated in an intra-crossbar parallelization.

13. The computer-implemented method of claim 9, wherein a matrix structure of weights operate on successive inputs to produce successive outputs.

14. The computer-implemented method of claim 9, wherein a size of a matrix structure of weights is corresponds with a size of the crossbar of the integrated chip.

15. The computer-implemented method of claim 9, wherein a size of the kernels in the convolution layer is smaller than a threshold size of a crossbar weights matrix.

16. A non-transitory computer-readable storage medium storing a plurality of instructions executable by one or more processors, the plurality of instructions when executed by the one or more processors cause the one or more processors to perform intra-crossbar parallelization and inter-crossbar parallelization that compute simultaneously on input data points by:
flattening kernels in a convolution layer into vectors;
grouping the vectors into a vector matrix, where the vector matrix comprises a plurality of lines;
replicating and storing duplicates of the vector matrix according to a number and size on the convolution layer of a convolutional neural network and a crossbar size of a crossbar, wherein the duplicates are stored in unused space of the crossbar of an integrated chip, comprising a crossbar matrix; and
computing a first convolution of the convolution layer as a dot product of input activations vector and the crossbar matrix, wherein the first convolution of the convolution layer corresponds with smaller weights than a second convolution of the convolution layer to parallelize separate iterations in the convolution layer in alignment with the intra-crossbar parallelization, and wherein the duplicates are computed simultaneously on the input data points to perform the intra-crossbar parallelization and the inter-crossbar parallelization.

17. The non-transitory computer-readable storage medium of claim 16, wherein the kernels correspond with a three-by-three kernel.

18. The non-transitory computer-readable storage medium of claim 16, wherein the one or more processors are implemented with a plurality of tiles connected with network on a chip, wherein each tile of the plurality of tiles is composed of SRAM or eDRAM memory buffers to store input values, a number of in-situ multiply-accumulate (IMA) units comprising a plurality of crossbars, and output registers to aggregate results, all connected with a shared bus.

19. The non-transitory computer-readable storage medium of claim 16, wherein weights in a matrix structure of weights are replicated in an intra-crossbar parallelization.

20. The non-transitory computer-readable storage medium of claim 16, wherein a matrix structure of weights operate on successive inputs to produce successive outputs.

21. The non-transitory computer-readable storage medium of claim 16, wherein a size of a matrix structure of weights is corresponds with a size of the crossbar of the integrated chip.

* * * * *